United States Patent [19]

Konishi et al.

[11] 4,456,652
[45] Jun. 26, 1984

[54] ELECTRICALLY CONDUCTIVE ADHESIVE TAPE

[75] Inventors: Toshiharu Konishi; Zenzo Honda; Yutaka Hori; Yukio Shimizu; Hideyuki Okada, all of Osaka, Japan

[73] Assignee: Nitto Electric Industrial Co., Ltd., Osaka, Japan

[21] Appl. No.: 469,476

[22] Filed: Feb. 24, 1983

[30] Foreign Application Priority Data

Feb. 24, 1982 [JP] Japan ............................ 57-25940[U]

[51] Int. Cl.³ ............................................. B32B 3/00
[52] U.S. Cl. .................................... 428/344; 428/137; 428/138; 428/174; 428/906
[58] Field of Search ............... 428/344, 139, 906, 137, 428/138, 120, 174, 209; 427/97

[56] References Cited

U.S. PATENT DOCUMENTS 3,497,383  2/1970  Olyphant ....................... 428/209 X Primary Examiner—Alexander Thomas
Attorney, Agent, or Firm—Sughrue, Mion, Zinn, Macpeak & Seas

[57] ABSTRACT

An electrically conductive adhesive tape comprising a self-supporting electrically conductive tape support and a pressure-sensitive adhesive layer provided on at least one surface of the tape support, wherein electrically conductive portions which extend through the adhesive layer and have a top end portion slightly covering the surface of the adhesive layer are provided on the side of the adhesive layer of the tape at desired intervals.

1 Claim, 6 Drawing Figures

ELECTRICALLY CONDUCTIVE ADHESIVE TAPE

FIELD OF THE INVENTION

The present invention relates to an electrically conductive adhesive tape having electrical conductivity in the direction of thickness. The term "tape" used herein includes both tape and sheet.

BACKGROUND OF THE INVENTION

Conventional electrically conductive adhesive tapes comprise an electrically conductive tape support and an electrically conductive pressure-sensitive adhesive layer containing dispersed therein electrically conductive powders. These tapes, however, suffer from the disadvantages that the adhesive strength of the adhesive layer is not satisfactorily sufficient because powder, e.g., non-sticky carbon, is compounded or dispersed therein.

An electrically conductive adhesive tape in which a pressure-sensitive adhesive layer is provided on one surface of the electrically conductive tape support and the resulting laminate is embossed to form a number of fine projections or lines sharped at predetermined intervals has been proposed to overcome the above-described problem. When voltage is applied across the electrically conductive adhesive tape bonded to the electrically conductive substrate, the adhesive layer causes dielectric breakdown at the areas contacting the fine projections or lines sharped, so that an electric current can pass through the tape. In such a tape, however, the fine projections or lines sharped are again covered with the adhesive layer when external pressure is applied to the bonded tape or by fluidity of the adhesive layer and, as a result, the electric resistance of the tape seriously increases.

SUMMARY OF THE INVENTION

Accordingly, an object of the invention is to provide a novel electrically conductive adhesive tape which is free from the above-described problems of the prior art tapes.

The present invention, therefore, relates to electrically conductive adhesive tapes comprising a self-supporting electrically conductive tape support and a pressure-sensitive adhesive layer provided on at least one surface of the tape support, characterized in that there is provided electrically conductive portion which extend through the adhesive layer and have a top end portion slightly covering the surface of the adhesive layer, in the tape at desired intervals.

DETAILED DESCRIPTION OF THE INVENTION

The invention will hereinafter be explained in greater detail by reference to the accompanying drawings.

Figure 1:
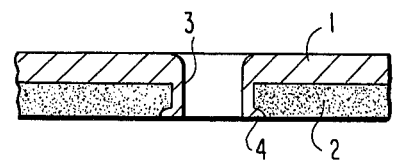
FIG. 1 is a partially enlarged cross-sectional view of an electrically conductive adhesive tape of the invention.
Figure 5A:
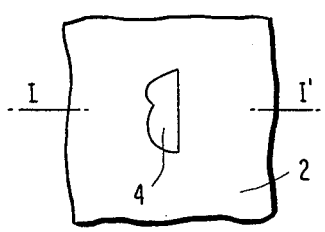
FIG. 5A is a partial top plan view of another electrically conductive adhesive tape of the invention and FIG. 5B is a partially enlarged cross-sectional view taken on line I—I' of FIG. 5A.
Figure 5B:
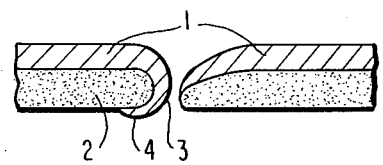

FIG. 1 shows an electrically conductive adhesive tape of the invention which comprises an electrically conductive tape support 1 composed of a metal foil such as copper, aluminum, silver, iron or lead (preferably having a thickness of from 10 to 200 $\mu$m), and a pressure-sensitive adhesive layer 2 provided on one surface of the tape support 1, the layer 2 comprising a rubber and/or a synthetic resin and preferably having a modulus of elasticity of from 0.3 to 3.5 kg/cm$^2$ at 20° C. The reference numeral 3 indicates an electically conductive portion which is made of a part of the tape support 1, extends through the adhesive layer 2, and has a terminal area 4 turning reversely on the surface of the adhesive layer 2 and slightly covering (about 10–300 $\mu$m) the surface thereof. These electrically conductive portions are provided in the electrically conductive adhesive layer at desired intervals. The terminal area 4 is constructed in the manner such that a laminate prepared by forming the adhesive layer 2 on the tape support is punched at desired interval by means of a street type machine so that the tape support 1 extends through the punched portion and projects slightly beyond the thickness of the adhesive layer 2 by utilizing the ductility of the support, the projected portion is rubbed with, for example, a doctor knife to bend and turn reversely on the surface of the adhesive layer and then the whole system is subjected to a press processing thereby forming the terminal area at the same plane of or slightly projecting beyond the adhesive layer surface. In this case, the terminal area 4 has a doughnut-like form or a nearly semicircular form (FIGS. 5A and 5B).

Figure 2:
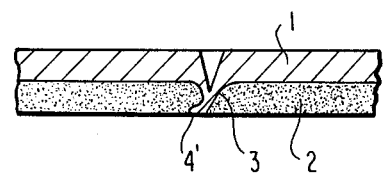
FIG. 2 is a partially enlarged cross-sectional view of another electrically conductive adhesive tape of the invention.
Figure 3:
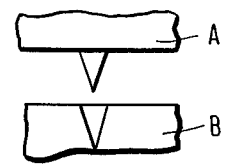
FIG. 3 is a partial illustrative view of a press mold for use in the production of the electrically conductive adhesive tape of FIG. 2.

FIG. 2 shows another electrically conductive adhesive tape of the invention. In this embodiment, for example, the composite material of the tape support 1 and the adhesive layer 2 is processed by means of a press mold comprising a male mold A and a female mold B as illustrated in FIG. 3 so that a needle-like tape support piece projects beyond the surface of the adhesive layer 2, and the projected portion is then bent on the adhesive layer 2 by, for example, pressing to form a terminal area 4'.

Figure 4:
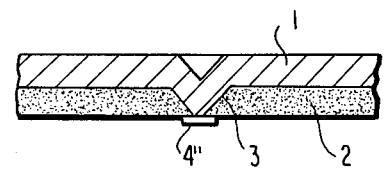
FIG. 4 is a partially enlarged cross-sectional view of another adhesive tape of the invention.

FIG. 4 shows another electrically conductive adhesive tape of the invention. In this embodiment, for example, the composite material of the tape support 1 and the adhesive layer 2 is processed so as to provide a small projection of the tape support which is equal to or slightly beyond the surface of the adhesive layer, and an electrically conductive piece such as a solder is adhered on the projection so that a part of the piece covers slightly the adhesive layer 2 to thereby form a terminal area 4".

Although not shown in the drawings, a releasing paper or its similar material may be temporarily provided to protect the surface of the adhesive layer 2, or conventional electrical insulating film or sheet may be bonded onto the surface of the tape support 1 to electrically insulate the surface. Furthermore, although the adhesive layer 2 is provided on one surface of the tape support 1 in the accompanying drawings, the adhesive layer 2 may be provided on both surfaces of the tape support 1 to produce a both side-adhesive type electrically conductive adhesive tape.

The electrically conductive tape of the present invention has the structure such that the terminal area composed of an electrically conductive material is bent on the surface of the adhesive layer to cover the layer at the same plane of or slightly extending the adhesive layer surface. Therefore, the terminal area directly contacts the surface of an article to which the tape is applied and, as a result, a secure current passing effect can be obtained and also a good adhesion state can be maintained.

The following examples are given to illustrate the invention in greater detail.

EXAMPLE 1

A 50 μm thick acrylic adhesive layer having a modulus of elasticity of 1 kg/cm$^2$ at 20° C. was provided on one surface of a 50 μm thick hard aluminum foil (specified in JIS H 4160 IN30). The thus-obtained composite material was slowly punched by means of a mold (female mold diameter: 500 μm, male mold diameter: 425 μm) provided with punching parts at 5 mm intervals to produce projections exceeding the surface of the adhesive layer. Thereafter, the entire surface was pressed to produce an electrically conductive adhesive tape as illustrated in FIG. 1.

In exactly the same manner as above, an electrically conductive adhesive tape was produced using a 50 μm thick soft aluminum foil (specified in JIS H 4160 IN30).

The hard aluminum tape sample is designated as S-1 and the soft aluminum tape sample is designated as S-2.

Each of composite materials prepared above was processed by means of a press mold (height of projections in the male mold: 150 μm, inner angle: 20°) to produce an electrically conductive adhesive tape as illustrated in FIG. 2. The hard aluminum tape sample is designated as S-3 and the soft aluminum tape sample is designated as S-4.

EXAMPLE 2

A 40 μm thick natural rubber adhesive layer having a modulus of elasticity of 0.5 kg/cm$^2$ at 20° C. was provided on one surface of a 40 μm thick copper foil (specified in JIS H 2103). The thus-obtained composite material was processed by means of the same punching mold as used in Example 1 and also a press mold to produce the two electrically conductive adhesive tapes. The tape produced by means of the punching mold is designated as S-5 and the tape produced by means of the press mold is designated as S-6.

COMPARISON EXAMPLE

The same acrylic adhesive layer (thickness: 40 μm) as used in Example 1 was provided on one surface of the same copper foil as used in Example 2 and then a release paper was provided on the surface of the layer. The thus-obtained composite material was passed through between a patterned metal roll and a rigid rubber roll under a pressure of 27 kg/cm in the manner such that the copper foil faces the metal roll to obtain an electrically conductive adhesive tape having an embossed copper foil. The tape produced is designated as S-7.

The patterned metal roll used had the surface such that the lines sharped having a height of 0.45 mm were formed in a checkered form with a width of 1.6 mm. Further, the thickness of the adhesive layer covering the top portion of the lines sharped present on the tape was about 2 to 3 μm.

The electric resistance and adhesive force of each of the samples were measured.

The test results obtained are shown in Table 1.

TABLE 1

| | Sample No. | | | | | | |
|---|---|---|---|---|---|---|---|
| | S-1 | S-2 | S-3 | S-4 | S-5 | S-6 | S-7 |
| Electric Resistance (Ω/cm$^2$, × 10$^{-3}$) | 5.0 | 4.5 | 4.0 | 4.0 | 3.0 | 1.5 | 3.0 (>10$^{15}$)* |
| Adhesive Strength (g/20 mm width) | 1,500 | 1,200 | 1,600 | 1,250 | 1,800 | 2,100 | 1,200 |

*The value pressed at 100 kg/cm
Electric resistance: measured according to MIL STANDARD 202C
Adhesive strength: measured according to ASTM D 1000

While the invention has been described in detail and with reference to specific embodiments thereof, it will be apparent to one skilled in the art that various changes and modifications can be made therein without departing from the spirit and scope thereof.

What is claimed is:

1. An electrically conductive adhesive tape comprising a self-supporting electrically conductive tape support and a pressure-sensitive adhesive layer provided on at least one surface of the tape support, wherein electrically conductive portions which extend from the support through the adhesive layer and have a top end portion slightly covering the surface of the adhesive layer are provided on the side of the adhesive layer of the tape at desired intervals.

* * * * *